United States Patent [19]

Iba

[11] Patent Number: 5,883,006
[45] Date of Patent: Mar. 16, 1999

[54] METHOD FOR MAKING A SEMICONDUCTOR DEVICE USING A FLOWABLE OXIDE FILM

[75] Inventor: Junichiro Iba, Lake Carmel, N.Y.

[73] Assignee: Kabushiki Kaisha Toshiba, Kawasaki, Japan

[21] Appl. No.: 989,859

[22] Filed: Dec. 12, 1997

[51] Int. Cl.$^6$ .................................................. H01L 21/00
[52] U.S. Cl. .......................... 438/712; 438/717; 438/738
[58] Field of Search .................................... 438/712, 717, 438/738

[56] References Cited

U.S. PATENT DOCUMENTS

| | | | |
|---|---|---|---|
| 4,372,034 | 2/1983 | Bohr | 438/640 |
| 4,451,326 | 5/1984 | Gwozdz | 437/195 |
| 5,026,666 | 6/1991 | Hills et al. | 437/195 |
| 5,174,858 | 12/1992 | Yamamoto et al. | 156/643 |
| 5,200,358 | 4/1993 | Bollinger et al. | 437/180 |
| 5,227,014 | 7/1993 | Crotti et al. | 156/644 |
| 5,266,526 | 11/1993 | Aoyama et al. | 437/195 |
| 5,340,774 | 8/1994 | Yen | 437/240 |
| 5,453,403 | 9/1995 | Meng et al. | 437/195 |
| 5,477,074 | 12/1995 | Yen | 257/377 |
| 5,500,080 | 3/1996 | Choi | 156/644.1 |
| 5,516,625 | 5/1996 | McNamara et al. | 438/404 |
| 5,530,293 | 6/1996 | Cohen et al. | 257/642 |
| 5,712,759 | 1/1998 | Saenger et al. | 361/321.4 |

*Primary Examiner*—Benjamin Utech
*Assistant Examiner*—Kin-Chan Chen
*Attorney, Agent, or Firm*—Banner & Witcoff, Ltd.

[57] ABSTRACT

A method of forming an opening in a first film is provided, wherein the opening has first and second opening portions and the first film is an insulating film. The first opening portion is formed in the first film and a second film is formed on an upper surface of the first film and to fill in the first opening portion. A masking film is formed on the second film. The first film and the second film are etched by a first etching process using the masking film as a mask to form the second opening portion. The first film and the second film are etched at substantially the same rate by the first etching process. The remaining portion of the second film in the first opening portion is etched by a second etching process. The second film is etched at a higher rate than the first film by the second etching process.

22 Claims, 8 Drawing Sheets

METHOD FOR MAKING A SEMICONDUCTOR DEVICE USING A FLOWABLE OXIDE FILM

BACKGROUND OF THE INVENTION

1. Technical Field

The present invention generally relates to methods for making a semiconductor device and, more particularly, to methods for a semiconductor device using a flowable oxide film.

2. Description of Related Art

Various processes for forming metal lines and contacts in semiconductor devices have been developed. In some cases, a metal film is deposited and then etched. In other cases, a so-called damascene process is utilized. A "damascene" process is a process in which a trench or an opening is formed in an insulating film and then filled in with a conductive material. The conductive material is then planarized. A "dual damascene" process involves the simultaneous fabrication of a conductive contact and a conductive wiring. Specifically, in a dual damascene process, a contact hole is formed in an insulating film such as a TEOS film and then a trench for the wiring is formed in the insulating film by widening an upper portion of the contact hole. A conductive material is then deposited on the insulating film and to fill in the contact hole and the trench. The deposited conductive material is then planarized by a planarization process such as chemical mechanical polishing (CMP) using the insulating film as a stopper. Such a dual damascene process reduces the number of process steps and eliminates an interface between the conductive contact and the conductive wiring.

Some steps of a conventional dual damascene process are shown in FIGS. 1(a)–1(d). With reference to FIG. 1(a), a contact hole 18 is formed in an insulating film 16 such as a TEOS film and exposes a portion of the upper surface of a conductive line 14 formed in an insulating layer 12. Next, as shown in FIG. 1(b), an antireflective coating (ARC) film 20 is deposited and a resist 22 is formed on ARC film 20. As can be seen in FIG. 1(b), due to the topography of the upper surface of ARC film 20 caused by contact-hole 18, resist 22 has a variable thickness. Resist 22 is selectively exposed and developed to provide a patterned resist layer as shown in FIG. 1(c). A reactive ion etching (RIE) process is then used to etch ARC film 20 and TEOS layer 16 using the patterned resist as a mask. ARC film 20 and TEOS film 16 have different etching rates. If, during this RIE process, the ARC film 20 is etched at a faster rate than TEOS film 16, conductive line 14 may be damaged. On the other hand, if during this RIE process, ARC film 20 is etched at a slower rate than TEOS film 16, a structure like that shown in FIG. 1(d) has been found to remain after the RIE process. After the removal of the remaining resist 22 and ARC film 20, TEOS spikes 24 adjacent to the contact hole/trench boundary remain. An adhesion/barrier film of, for example, titanium nitride is then deposited on the surface of TEOS film 16 and on the sidewalls and bottom walls of the contact hole and trench. However, in the regions of TEOS spikes 24, the adhesion/barrier film is unevenly deposited and, in some areas, may not be deposited at all. Thus, in a subsequent step during which a conductive material such as tungsten is sputtered or deposited in the contact hole and trench, voids in the tungsten can occur in regions where the adhesion/barrier layer is not present. This can lead to discontinuities and increased resistance of the contacts and lines formed by the tungsten. In addition, with reference to FIG. 1(b), the varying thickness of resist 22 adversely impacts the lithography process and contributes to the difficulty in forming trenches having highly accurate dimensions. Similar problems occur if ARC film 20 is omitted and resist 22 is deposited on the upper surface of TEOS layer 16 and to fill in contact hole 18.

SUMMARY OF THE INVENTION

In accordance with one aspect of the present invention, a method of forming an opening in a first film is provided, wherein the opening has first and second opening portions and the first film is an insulating film. The first opening portion is formed in the first film and a second film is formed on an upper surface of the first film and to fill in the first opening portion. A masking film is formed on the second film. The first film and the second film are etched by a first etching process using the masking film as a mask to form the second opening portion. The first film and the second film are etched at substantially the same rate by the first etching process. The remaining portion of the second film in the first opening portion is etched by a second etching process. The second film is etched at a higher rate than the first film by the second etching process.

Since the first film and the second film are etched at substantially the same rate by the first etching process, damage to any layers exposed by the opening can be avoided. In addition, the opening has smooth sidewalls and bottom walls and conductive material can be filled into the opening without voids resulting from spikes on the walls of the opening. Still further, the masking film can be formed with a substantially uniform thickness.

In accordance with another aspect of the present invention, a method of forming an interconnection is provided in which a first opening portion is formed in a first film, the first film being an insulating film. A second film is formed on an upper surface of the first film and to fill in the first opening portion, and a masking film is formed on the second film. The first film and the second film are etched by a first etching process using the masking film as a mask to form a second opening portion, the first film and the second film being etched at substantially the same rate by the first etching process. The remaining portion of the second film in the first opening portion is etched by a second etching process, the second film being etched at a higher rate than the first film by the second etching process. The first and second opening portions are then filled in with a conductive material.

Since the first film and the second film are etched at substantially the same rate by the first etching process, damage to any layers exposed by the opening can be avoided. In addition, the opening has smooth sidewalls and bottom walls and the conductive material can be filled into the opening without voids resulting from spikes on the walls of the opening. Still further, the masking film can be formed with a substantially uniform thickness.

In accordance with still another aspect of the present invention, a method for forming a shallow trench isolation structure in a semiconductor substrate for isolating adjacent deep trench capacitors from each other is provided. A flowable oxide film is formed on a upper surface of at least one pad film and to fill in an opening formed in the at least one pad film which exposes at least portion of the upper surface of the deep trench capacitors. A patterned resist is formed on the flowable oxide film and the flowable oxide film is etched using the patterned resist as a mask. The at least one pad film, the semiconductor substrate, and the deep trench capacitor are etched using the patterned resist as a mask to form a shallow trench, the remaining portion of the etched flowable oxide film constituting an etching mask if the patterned resist is etched away by the etching process. The shallow trench is then filled in with an insulating material.

In accordance with this method, the flowable oxide film permits a resist having a substantially uniform thickness to be utilized. In addition, since the flowable oxide film serves as an etch mask, a relatively thin resist can be utilized, thereby enhancing the lithography process.

These and other features and aspects of the invention will be more clearly understood and better described if the following detailed description is read in conjunction with the appended drawings.

DETAILED DESCRIPTION

Figure 1A:
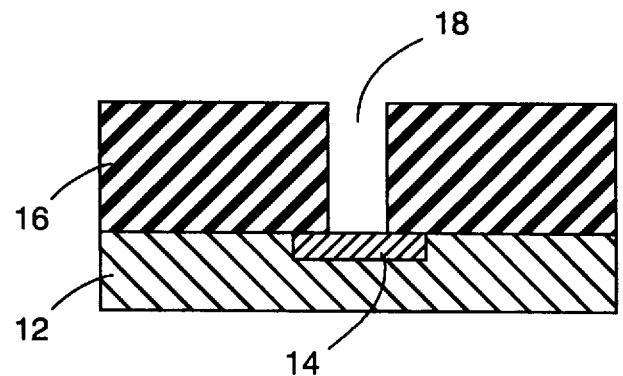
FIGS. 1 (a)–1(d) illustrate some steps of a conventional dual damascene process.
Figure 1B:
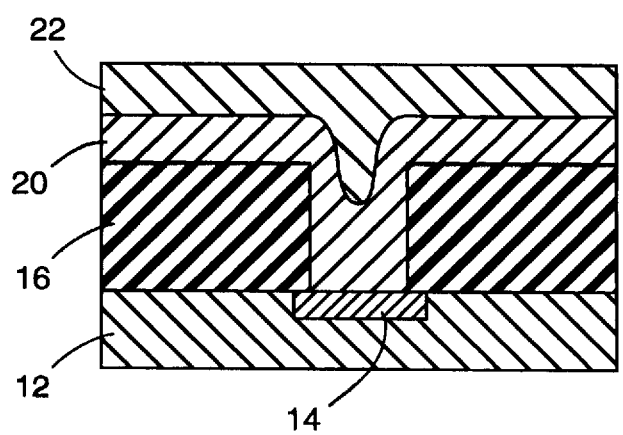
Figure 1C:
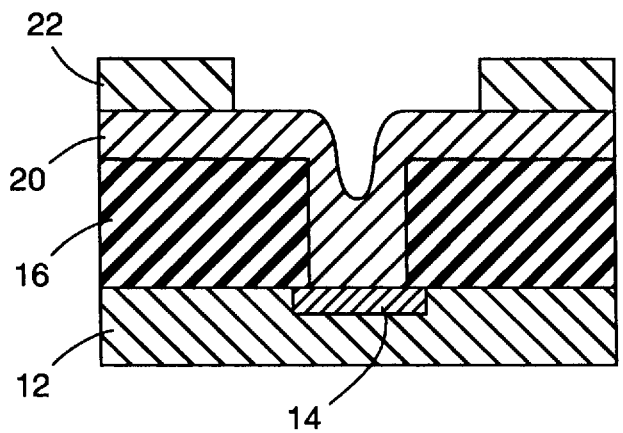
Figure 1D:
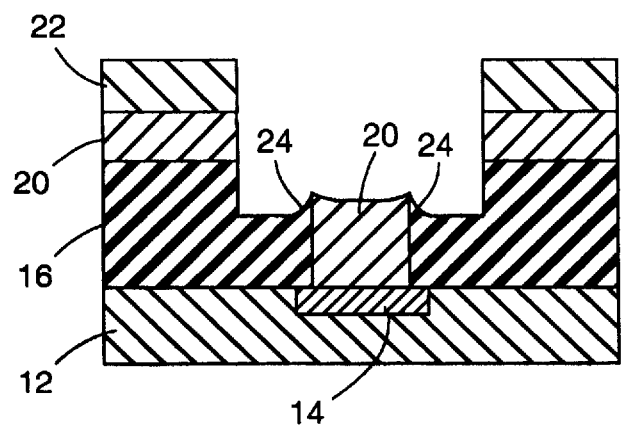
Figure 2A:
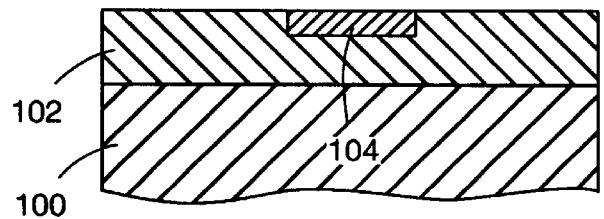
FIGS. 2(a)–2(h) illustrate a dual damascene process in accordance with a first embodiment of the present invention.

The method of the present invention will be described with reference to the dual damascene process shown in FIGS. 2(a)–2(h). FIG. 2(a) shows a first insulating film 102 of silicon dioxide ($SiO_2$), borophosphosilicate glass (BPSG), phosphosilicate glass (PSG), silicon nitride ($Si_3N_4$), or some other insulating material formed on an underlying substrate 100. Substrate 100 may be a substrate of insulating, conducting or semiconducting material. First insulating film 102 has a conductive line 104 formed therein by the damascene process. Conductive line 104 is, for example, formed of tungsten (W) and has a thickness of about 200 nm (nanometers) and a width of about 300 nm (nanometers). In accordance with the damascene process, an opening is formed in first insulating film 102 using a conventional lithography process, followed by reactive ion etching. Tungsten is sputtered or deposited by a chemical vapor deposition (CVD) and then planarized by a CMP process, wherein first insulating film 102 is used as a stopper for the CMP process. If desired, an adhesion/barrier film of, for example, titanium nitride may be formed prior to the sputtering or deposition of the tungsten.

Figure 2B:
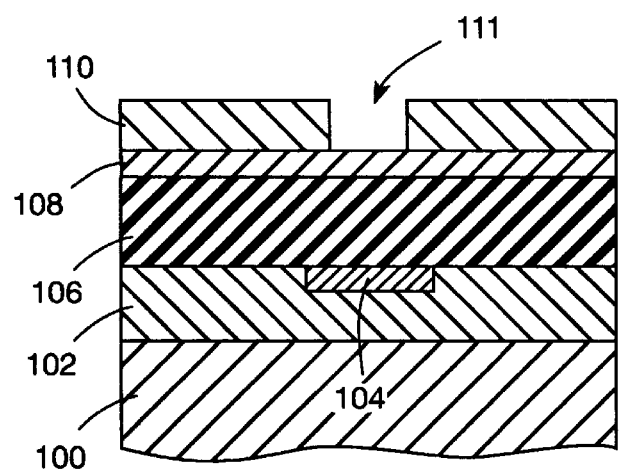

Referring to FIG. 2(b), a second insulating film 106 is formed on first insulating film 102. Second insulating film 106 has a thickness of about 1100 nm (nanometers) and is, for example, a TEOS film formed by low pressure chemical vapor deposition (LPCVD) or plasma enhanced chemical vapor deposition (PECVD). An antireflective coating (ARC) film 108 such as BARL available from Shipley having a thickness of about 45 nanometers is formed on second insulating film 106. ARC film 108 is provided for the purpose of reducing reflections of the radiation using for exposing a radiation sensitive film formed on ARC film 108 in a subsequent process step.

A radiation sensitive film 110 such as a photoresist is formed on ARC film 108. Radiation sensitive film 110 may be a resist having a thickness of about 850 nm (nanometers) and may, for example, be APEX-E or UV2HS available from Shipley. Other types of resist may be utilized including by way of example, but not limitation, chemically amplified resists, non-chemically amplified resists, positive-type resists, and negative-type resists. The resist is exposed using a mask (not shown) and then developed so as to define a pattern in resist 110. In the case of resist 110, the pattern includes an opening 111. The exposure tool may be a Micrascan II available from SVGL, Inc. or an NSR-S201A available from Nikon Corp. In more advanced lithography, a 193 nanometer single-band ArF excimer laser may be used.

Figure 2C:
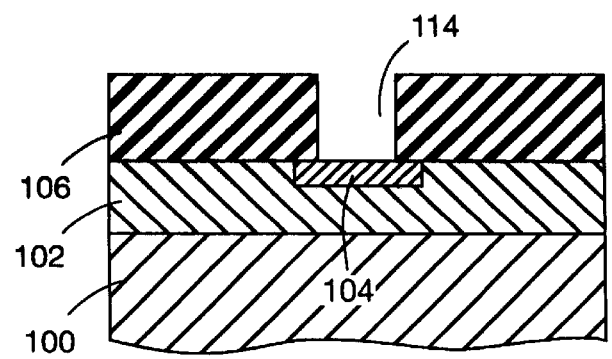

With reference to FIG. 2(c), a contact hole 114 exposing at least a portion of conductive line 104 is formed in TEOS film 106 by an RIE process for etching ARC film 108 and second insulating film 106 using the patterned resist 110 as a mask. ARC film 108 is etched, for example, using an $O_2$ gas or an $O_2$—$CF_4$ mixed gas. TEOS film 106 is etched, for example, using a $CF_4$ gas or some other $CF_4$-type gas such as $CHF_3$, or $C_4F_8$. After forming contact hole 114, resist 110 and the remaining ARC film 108 are removed.

Figure 2D:
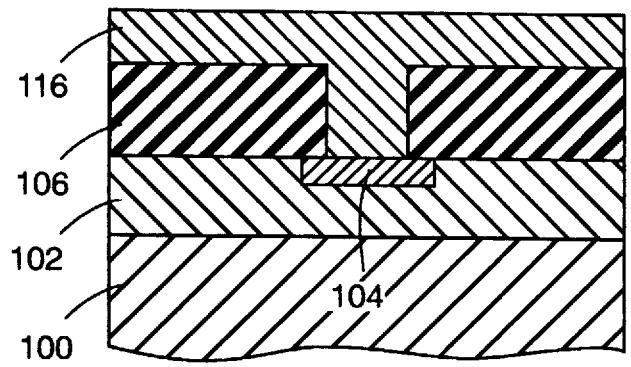

With reference to FIG. 2(d), a flowable oxide film 116 such as FOX available from Dow Corning Corporation is deposited on the upper surface of TEOS film 106 and to fill in contact hole 114. The thickness of film 116 on the upper surface of second insulating film 106 is about 0.1 $\mu m$ (micrometers). As described in U.S. Pat. Nos. 5,530,293 and 5,085,893, each of which is incorporated herein by reference, flowable oxides can be obtained from hydrogen silsesquioxanes, which are carbon free $SiO_2$ precursors. These flowable oxides can be represented by the formula

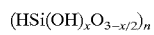

where n is an integer greater than about 8 and x is a number between 0 and 2.

A flowable oxide film suitable for use in the method of the present invention is one in which the solvent is methyl iosbutyl ketone (MIBK) and the silanol content is between about 0.1% to 20% by weight, depending on the desired thickness of the film. For example, the silanol content is about 5% by weight for a film having a thickness of 0.1 $\mu m$ (micrometers).

Flowable oxide film 116 is applied by spin coating at room temperature and then baked. The baking is at a temperature of 150° C. for one minute to evaporate the solvent and then at temperatures of 200° C. for one minute and 350° C. for one minute to reflow the flowable oxide film 116. The baking occurs in an atmosphere of air or nitrogen. For reasons to be discussed below, a surface hardening process such as a plasma $O_2$ ashing process at a temperature of about 200° C. may be performed in addition to the baking process to ensure that solvent of the surface portion of flowable oxide film 116 is completely evaporated.

Figure 2E:
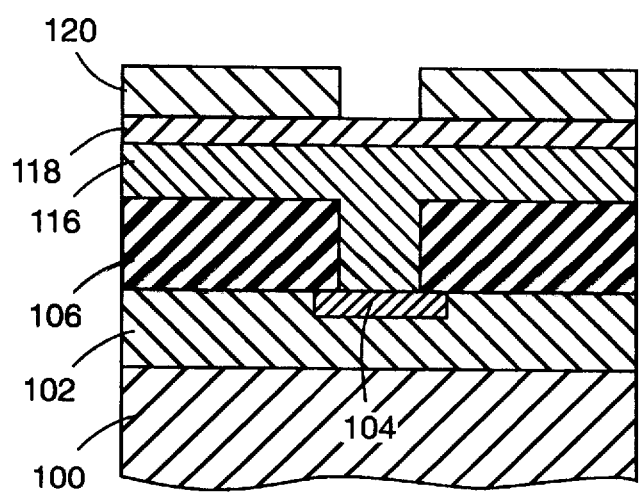

An antireflective coating (ARC) film 118 such as the above-mentioned BARL is then formed on flowable oxide film 116 as shown in FIG. 2(e). It is desirable to avoid mixing of the solvent of ARC film 118 and the solvent of flowable oxide film 116. The baking and ashing processes described above serve to evaporate the solvent of flowable oxide film 116 at least at the surface of flowable oxide film 116 to avoid any solvent mixing. Alternatively, an ARC film 118 with a solvent with does not mix with the solvent of flowable oxide film 116 can be utilized.

Figure 2F:
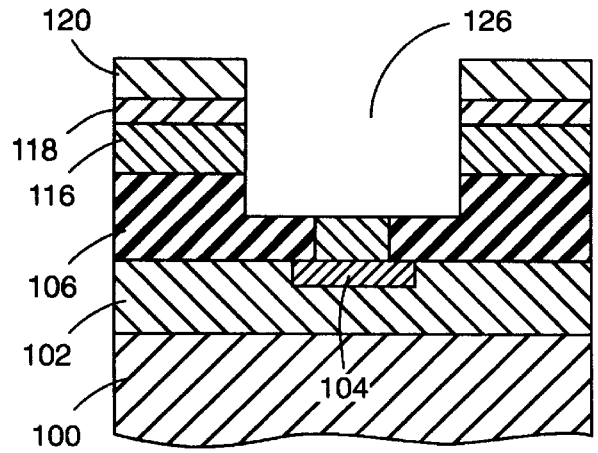

A radiation sensitive film 120 such as the above-mentioned APEX-E or UV2HS resists is then formed to a thickness of about 850 nm (nanometers) on ARC film 118. Again, other types of resist may be utilized including by way of example, but not limitation, chemically amplified resists, non-chemically amplified resists, positive-type resists, and negative-type resists. By providing flowable oxide film 116, resist 120 may be formed with a substantially uniform thickness and thus the performance of the lithography process can be improved. The resist is exposed using a mask (not shown) and developed to define a pattern in resist 120. An etching process such as a reactive ion etching process is performed using the patterned resist as a mask to etch ARC film 118, flowable oxide film 116, and TEOS film 106 to form a trench 126 as shown in FIG. 2(f). ARC film 118 may be etched using $O_2$ gas or an $O_2$—$CF_4$ mixed gas and flowable oxide film 116 and TEOS film 106 may be etched using a $CF_4$ gas or some other $CF_4$-type gas such as $CHF_3$, or $C_4F_8$. During this etching process, flowable oxide film 116 and TEOS film 106 are etched at substantially the same rate and thus no TEOS spikes are formed and no damage to conductive line 104 occurs.

Figure 2G:
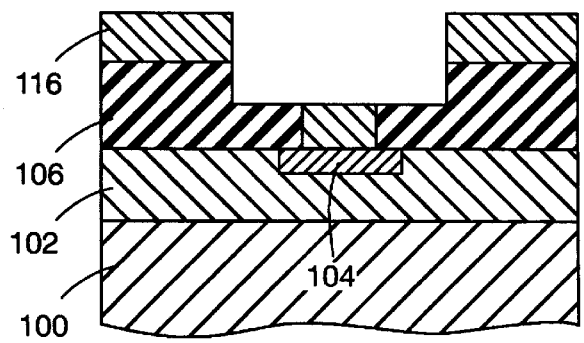

Resist 120 and the remaining portions of ARC film 118 are then removed as shown in FIG. 2(g). At this time, flowable oxide film 116 remains on the upper surface of TEOS film 106 and in contact hole 114. This remaining flowable oxide is then removed using, for example, an alkali such as a resist developer or an ammonia-based liquid such as $NH_3OH$ or tetramethyl ammonium hydroxide (TMAH). Weak acids such as an HF-based acid or a buffered HF-based acid may also be utilized. Whatever process is used to remove the remaining flowable oxide, the process should have a very high selectivity for removing the flowable oxide (e.g., a selectivity of about 100). In this way, the flowable oxide film 116 can be easily removed without damage to TEOS silicon dioxide film 106.

Figure 2H:
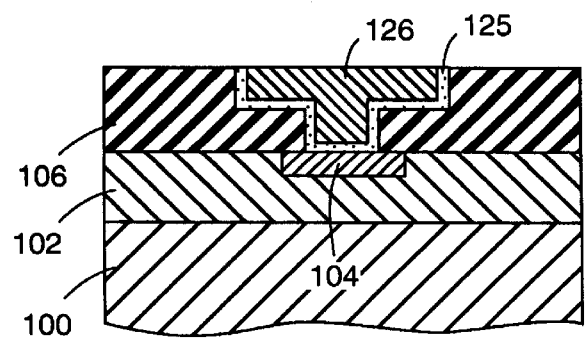

An adhesion/barrier layer 125 of, for example, titanium nitride is then formed by sputtering, for example, on the upper surface of TEOS film 106 and on the sidewalls and bottom walls of trench 126 and contact hole 114. A conductive material 126, such as tungsten, is then formed by, for example, sputtering or a blanket CVD process on the upper surface of second insulating film 106 and to fill in contact opening 114 and trench 126, thereby simultaneously forming a contact and a metal line. The conductive material is then planarized as shown in FIG. 2(h), using TEOS film 106 as a stopper for the planarization process.

Various modifications to the above-described method may be implemented. For example, the line opening (trench) can be formed prior to forming the contact opening. It is noted, however, that forming the contact hole first improves planarity since the narrower contact opening results in a smaller non-uniformity in the flowable oxide film above the contact opening. In addition, while ARC films are used in the process described above, they may be omitted, if desired. Still further, the flowable oxide film in the embodiment described above constitutes an illustrative, but non-limiting, feature of the present invention. Other films which have substantially the same etching rate as the surrounding material during the etching process for forming the trench and which also have a faster etching rate than the surrounding material during the etching process for removing the remaining portion of the film may also be utilized.

Figure 3A:
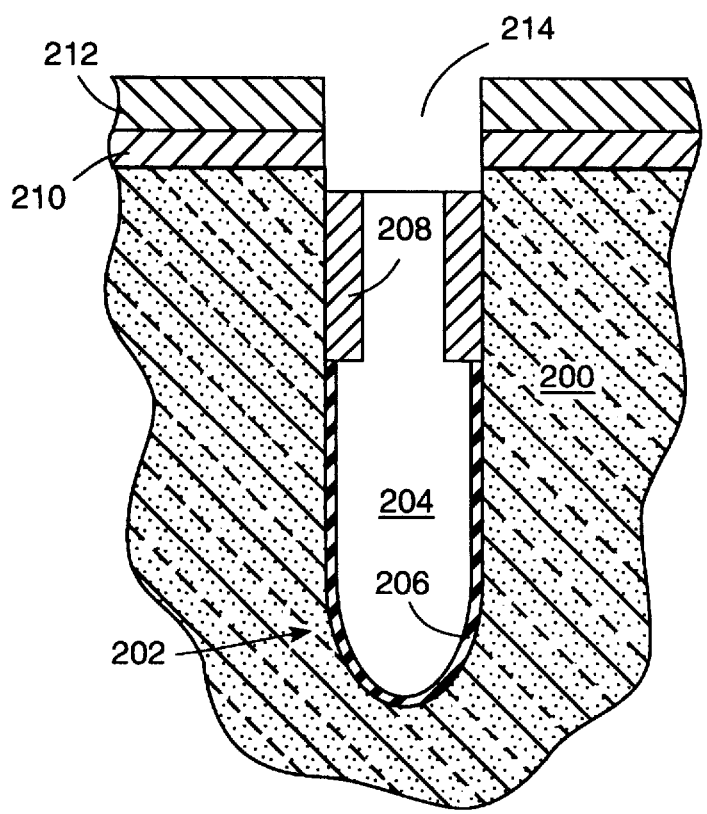
FIG. 3(a)–3(e) illustrate a shallow trench isolation process in accordance with a second embodiment of the present invention.
Figure 3B:
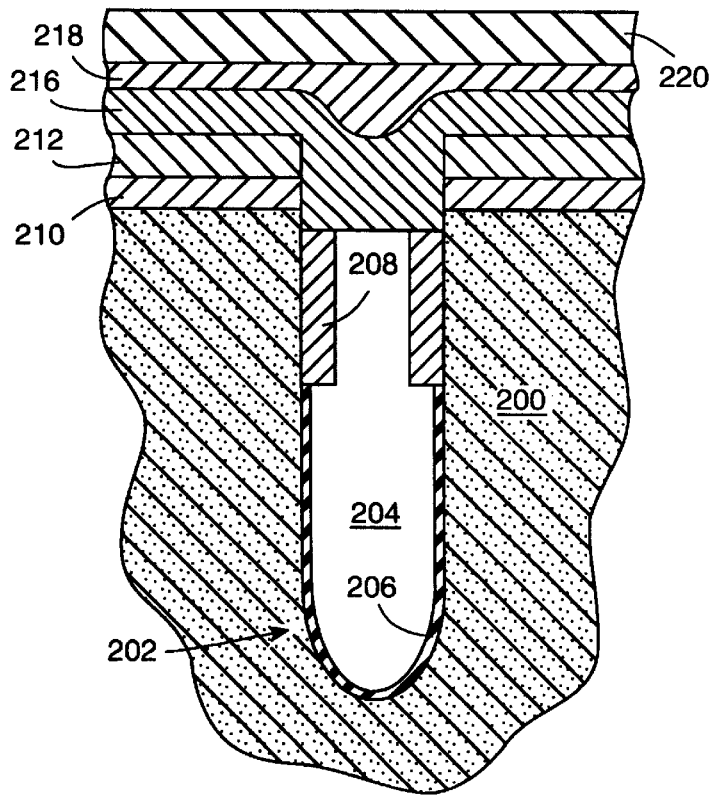
Figure 3C:
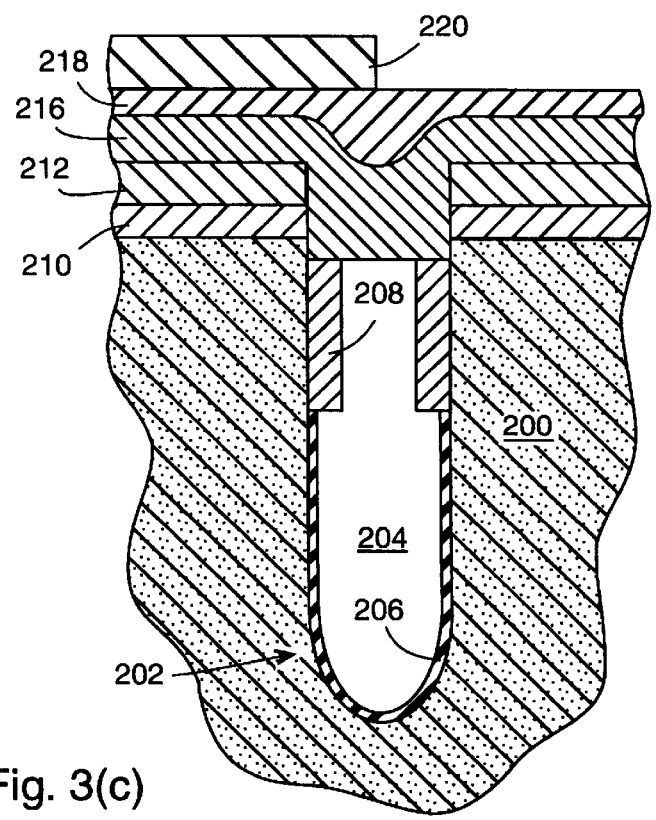
Figure 3D:
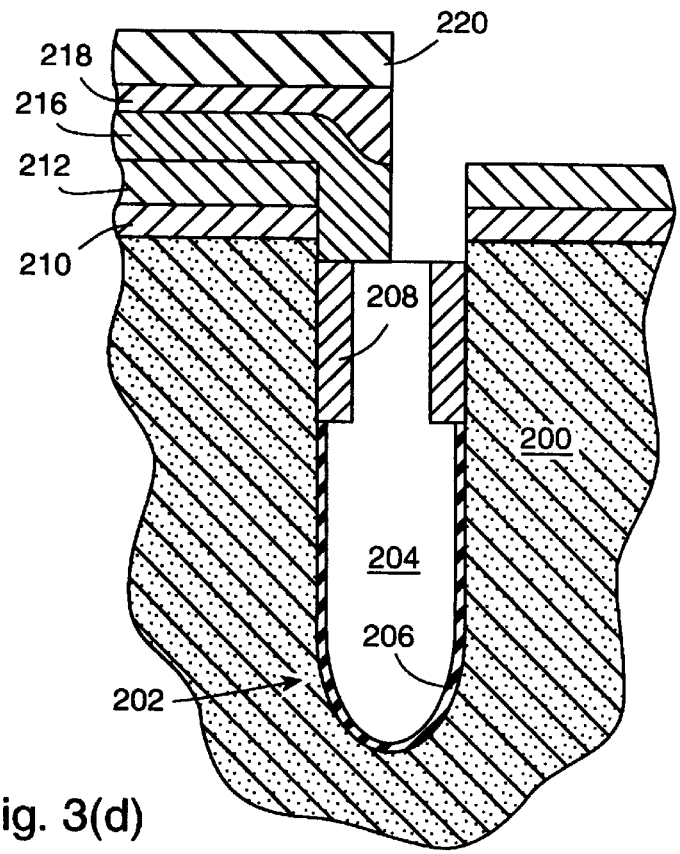
Figure 3E:
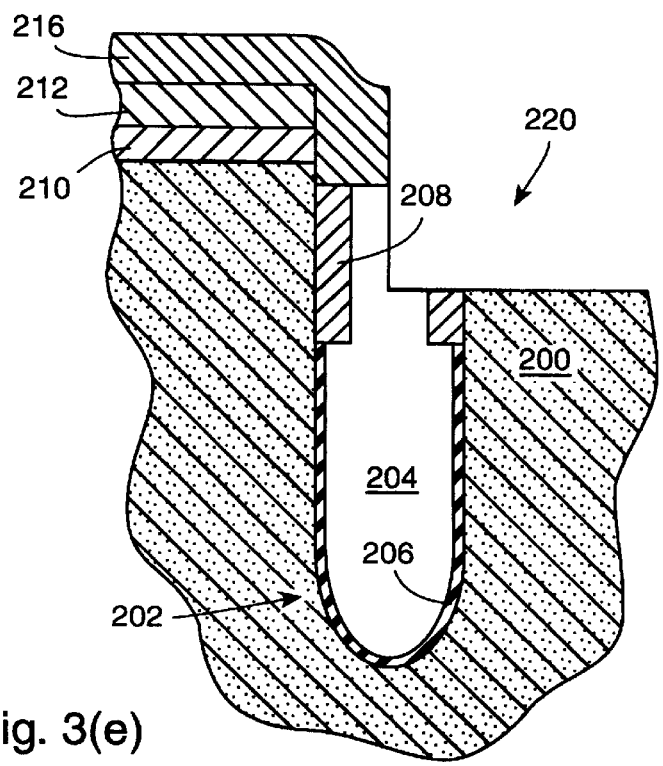

A flowable oxide film may be utilized in other processes for manufacturing semiconductor devices. One example is in the case of forming memory cells usable in a 256 Mbit dynamic random access memory (DRAM) device. Such memory cells are described in Nesbit et al., "A 0.6 $\mu m^2$ 256 Mb Trench DRAM Cell With Self-Aligned BuriEd STrap (BEST), IEDM 1993, pp.627–630, which is incorporated herein by reference. Each memory cell includes a deep trench capacitor and a transfer gate and is formed in an active area (AA) which is isolated from other memory cells by a shallow trench isolation structure. A cross-sectional view during the fabrication process for forming a memory cell such as the memory cell described in the Nesbit article is shown in FIG. 3(a). Specifically, the view of FIG. 3(a) is a view prior to an RIE process for etching shallow trenches for isolating memory cells from each other and shows a deep trench 202 formed in a semiconductor (e.g., silicon) substrate 200. A conductive trench fill 204 is formed in deep trench 202. For convenience, the various trench fills described in the Nesbit article are shown as a single trench fill in FIG. 3(a). Trench fill 204 is insulated from semiconductor substrate 200 by a storage node insulating film 206 and a collar oxide film 208. A pad silicon dioxide ($SiO_2$) film 210 and a pad silicon nitride ($Si_3N_4$) film 212 are on the surface of semiconductor substrate 200. An opening 214 in pad oxide film 210 and pad nitride film 212 exposes an upper surface of trench fill 204. With reference to FIG. 3(b), in accordance with a second embodiment of the present invention, a flowable oxide film 216 is formed on the upper surface of pad silicon nitride film 212 and to fill in opening 214. An ARC film 218 is formed on flowable oxide film 216 and a resist 220 is formed on ARC film 218. By providing flowable oxide film 216, resist 220 will have a substantially uniform thickness. Resist 220 is selectively exposed using a mask for defining the shallow trench isolation structures and then developed to leave a patterned resist as shown in FIG. 3(c). Next, ARC film 218 and flowable oxide film 216 are etched using the patterned resist 220 as a mask to leave the structure shown in FIG. 3(d). Although the etch is selective to ARC film 218 and flowable oxide film 216, some or even all of the patterned resist 220 and the underlying ARC film 218 may also be removed. Next, with reference to FIG. 3(e), an RIE process is performed to etch pad silicon nitride film 212, pad silicon dioxide film 210, substrate 200, trench fill 204 and collar oxide film 208 using as a mask any remaining patterned resist 220 and ARC film 218 and, after complete removal of resist 220 and ARC film 218, the remaining flowable oxide film 216. Specifically, during this RIE etching, any remaining resist 220 and ARC film 218 will likely be removed. However, even after the resist is removed, flowable oxide film 216 serves as an etching mask since the etching rate of flowable oxide film 216 is slower than the etching rates of silicon nitride (i.e., pad silicon nitride film 212), silicon (i.e., semiconductor substrate 200), and polysilicon (i.e., trench fill 204). Although the etching rates of pad silicon dioxide film 210 and collar oxide film 208 and the etching rate of flowable oxide film 216 are similar, pad silicon dioxide film 210 and collar oxide 208 are very thin films and thus do not significantly impact on the ability to use the flowable oxide film 216 of FIG. 3(d) as a mask. Since the flowable oxide serves as a mask even after resist 220 is removed, a relatively thin resist may be utilized for the lithography process, thereby enhancing the lithography performance. After the remaining portion of flowable oxide film 216 of FIG. 2(e) is removed, shallow trench 220 is filled in with an insulator such as TEOS to form a shallow trench isolation structure.

While there has been shown and described the preferred embodiments of the invention, it will be evident to those skilled in the art that various modifications may be made thereto without departing from the spirit and scope of the invention as set forth in the appended claims.

I claim:

1. A method of forming an opening in a first film, wherein said opening has first and second opening portions and said first film is an insulating film, the method comprising the steps of:

forming said first opening portion in said first film;

forming a second film on an upper surface of said first film and to fill in said first opening portion;

forming a masking film on said second film;

etching by a first etching process said first film and said second film using said masking film as a mask to form said second opening portion, wherein said first film and said second film are etched at substantially the same rate by the first etching process; and etching by a second etching process the remaining portion of said second film in said first opening portion, wherein said second film is etched at a higher rate than said first film by the second etching process.

2. The method according to claim 1, wherein said first film is a TEOS film.

3. The method according to claim 1, wherein said second film is a $(HSi(OH)_xO_{3-x/2})_n$ film where n is an integer greater than about 8, x is a number between 0 and 2.

4. The method according to claim 1, comprising the further step of:

forming an antireflective coating film on said second film prior to forming said masking film.

5. The method according to claim 1, wherein said masking film comprises a patterned resist film.

6. The method according to claim 1, wherein the remaining portion of said first film is removed using an alkali.

7. The method according to claim 1, wherein the remaining portion of said second film is removed using a weak acid.

8. The method according to claim 1, wherein the first etching process is a reactive ion etching (RIE) process.

9. The method according to claim 1, wherein said first opening portion is a contact hole and said second opening portion is a trench which is wider than said contact hole.

10. The method according to claim 1, wherein said first opening portion is a trench and said second opening portion is a contact hole which is narrower than said trench.

11. A method of forming an interconnection, the method comprising the steps of:

forming a first opening portion in a first film, wherein said first film is an insulating film;

forming a second film on an upper surface of said first film and to fill in said first opening portion;

forming a masking film on said second film;

etching by a first etching process said first film and said second film using said masking film as a mask to form a second opening portion, wherein said first film and said second film are etched at substantially the same rate by the first etching process;

etching by a second etching process the remaining portion of said second film in said first opening portion, wherein said second film is etched at a higher rate than said first film by the second etching process; and filling in said first and second opening portions with a conductive material.

12. The method according to claim 11, wherein said first film is a TEOS film.

13. The method according to claim 11, wherein said second film is a $(HSi(OH)_xO_{3-x/2})_n$ film, where n is an integer greater than about 8, x is a number between 0 and 2.

14. The method according to claim 11, comprising the further step of:

forming an antireflective coating film on said second film prior to forming said masking film.

15. The method according to claim 11, wherein said masking film comprises a patterned resist film.

16. The method according to claim 11, wherein the first etching process is a reactive ion etching (RIE) process.

17. The method according to claim 11, wherein the remaining portion of said second film is removed using an alkali.

18. The method according to claim 11, wherein said conductive material comprises tungsten.

19. The method according to claim 18, wherein said conductive material further comprises titanium nitride.

20. The method according to claim 11, wherein said first opening portion is a contact hole and said second opening portion is a trench which is wider than said contact hole.

21. The method according to claim 11, wherein said first opening portion is a trench and said second opening portion is a contact hole which is narrower than said trench.

22. A method for forming a shallow trench isolation structure in a semiconductor substrate for isolating adjacent deep trench capacitors from each other, the method comprising the steps of:

forming a flowable oxide film on a upper surface of at least one pad film and to fill in an opening formed in said at least one pad film which exposes at least portion of the upper surface of said deep trench capacitors;

forming a patterned resist on said flowable oxide film;

etching said flowable oxide film using said patterned resist as a mask;

etching said at least one pad film, said semiconductor substrate, and said deep trench capacitor using said patterned resist as a mask to form a shallow trench, wherein the remaining portion of the etched flowable oxide film constitutes an etching mask if said patterned resist is etched away by the etching process; and filling said shallow trench with an insulating material.

* * * * *